(12) United States Patent
Chuang et al.

(10) Patent No.: US 10,858,736 B2
(45) Date of Patent: *Dec. 8, 2020

(54) ATOMIC LAYER DEPOSITION METHOD

(71) Applicant: Taiwan Semiconductor Manufacturing Company, Ltd., Hsin-Chu (TW)

(72) Inventors: Chia-Yi Chuang, Taipei (TW); Hsing-Jui Lee, Hsin-Chu (TW); Ming-Te Chen, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 738 days.

This patent is subject to a terminal disclaimer.

(21) Appl. No.: 15/371,068

(22) Filed: Dec. 6, 2016

(65) Prior Publication Data

US 2017/0081761 A1  Mar. 23, 2017

Related U.S. Application Data

(63) Continuation of application No. 13/692,972, filed on Dec. 3, 2012, now Pat. No. 9,512,519.

(51) Int. Cl.
| | |
|---|---|
| *C23C 16/455* | (2006.01) |
| *C30B 25/14* | (2006.01) |
| *C23C 16/458* | (2006.01) |
| *H01L 21/02* | (2006.01) |
| *H01J 37/32* | (2006.01) |

(Continued)

(52) U.S. Cl.
CPC ...... *C23C 16/45527* (2013.01); *C23C 16/455* (2013.01); *C23C 16/4583* (2013.01); *C23C 16/45544* (2013.01); *C23C 16/45546* (2013.01); *C23C 16/45548* (2013.01); *C23C 16/45574* (2013.01); *C23C 16/45578* (2013.01); *C23C 16/46* (2013.01); *C30B 25/14* (2013.01); *C30B 31/16* (2013.01); *H01J 37/3244* (2013.01);

(Continued)

(58) Field of Classification Search
None
See application file for complete search history.

(56) References Cited

U.S. PATENT DOCUMENTS

| | | | |
|---|---|---|---|
| 4,096,822 A | 6/1978 | Yamawaki et al. | |
| 4,183,320 A | 1/1980 | Erben et al. | |

(Continued)

FOREIGN PATENT DOCUMENTS

| | | | | |
|---|---|---|---|---|
| JP | 10074701 A | * | 3/1998 | ........... C23C 14/505 |
| WO | WO-2009055065 A1 | * | 4/2009 | ........... C23C 14/505 |
| WO | WO-2013054652 A1 | * | 4/2013 | ........... C23C 16/405 |

OTHER PUBLICATIONS

M. Leskela, M. Ritala, "Atomic Layer Deposition Chemistry: Recent Developments and Future Challenges," Angew. Chem. Int. Ed. 42 (45) (2003) 5548-5554.

*Primary Examiner* — Jeffrie R Lund
*Assistant Examiner* — Stanislav Antolin
(74) *Attorney, Agent, or Firm* — Slater Matsil, LLP

(57) ABSTRACT

An atomic layer deposition apparatus includes a chamber including a plurality of regions; and a heating device respectively providing specific temperature ranges for the plurality of regions. By flowing precursor gases at different flow rates in the different regions, thin films can be simultaneously formed in the different regions having different film thicknesses.

19 Claims, 7 Drawing Sheets

(51) Int. Cl.
*H01L 21/314* (2006.01)
*C30B 31/16* (2006.01)
*C23C 16/46* (2006.01)

(52) U.S. Cl.
CPC ...... *H01L 21/0228* (2013.01); *H01L 21/3141* (2013.01)

(56) References Cited

U.S. PATENT DOCUMENTS

| | | | |
|---|---|---|---|
| 5,164,012 A | 11/1992 | Hattori | |
| 5,338,362 A | 8/1994 | Imahashi | |
| 5,855,465 A * | 1/1999 | Boitnott | H01L 21/67745 204/298.25 |
| 5,863,602 A * | 1/1999 | Watanabe | C23C 16/4404 427/237 |
| 5,925,188 A | 7/1999 | Oh | |
| 6,074,486 A | 6/2000 | Yang et al. | |
| 6,435,865 B1 | 8/2002 | Tseng et al. | |
| 6,527,866 B1 | 3/2003 | Matijasevic et al. | |
| 6,586,349 B1 * | 7/2003 | Jeon | C23C 16/029 438/785 |
| 6,746,240 B2 | 6/2004 | De Ridder et al. | |
| 6,962,859 B2 | 11/2005 | Todd et al. | |
| 8,790,463 B2 * | 7/2014 | Moriya | C23C 16/04 117/200 |
| 9,512,519 B2 * | 12/2016 | Chuang | C23C 16/45548 |
| 2001/0029892 A1 * | 10/2001 | Cook | C23C 16/44 118/723 E |
| 2001/0032986 A1 * | 10/2001 | Miyasaka | F16C 29/00 257/192 |
| 2002/0134507 A1 | 9/2002 | DeDontney et al. | |
| 2002/0179293 A1 * | 12/2002 | Yamazaki | F28D 15/00 165/157 |
| 2003/0087108 A1 | 5/2003 | Herner et al. | |
| 2003/0111013 A1 * | 6/2003 | Oosterlaken | C23C 16/22 118/724 |
| 2003/0119288 A1 | 6/2003 | Yamazaki et al. | |
| 2003/0124798 A1 * | 7/2003 | Lim | C23C 16/34 438/253 |
| 2003/0186517 A1 | 10/2003 | Takagi | |
| 2004/0023516 A1 * | 2/2004 | Londergan | C23C 16/4404 438/785 |
| 2004/0025786 A1 | 2/2004 | Kontani et al. | |
| 2004/0067641 A1 | 4/2004 | Yudovsky | |
| 2004/0142558 A1 | 7/2004 | Granneman | |
| 2004/0147053 A1 * | 7/2004 | Glew | G02B 6/1228 438/31 |
| 2004/0250853 A1 | 12/2004 | Snijders | |
| 2005/0045102 A1 | 3/2005 | Zheng et al. | |
| 2005/0118837 A1 | 6/2005 | Todd et al. | |
| 2005/0164466 A1 * | 7/2005 | Zheng | H01L 21/3141 438/398 |
| 2005/0201894 A1 * | 9/2005 | Suzuki | C23C 16/46 427/255.28 |
| 2005/0277288 A1 * | 12/2005 | Ozguz | H01L 21/76898 438/637 |
| 2006/0060137 A1 | 3/2006 | Hasper et al. | |
| 2006/0088985 A1 | 4/2006 | Haverkort et al. | |
| 2006/0148151 A1 * | 7/2006 | Murthy | H01L 21/02381 438/197 |
| 2006/0154494 A1 * | 7/2006 | Qi | C23C 16/045 438/787 |
| 2006/0159847 A1 | 7/2006 | Porter et al. | |
| 2006/0166501 A1 | 7/2006 | Kaushal et al. | |
| 2006/0196418 A1 | 9/2006 | Lindfors et al. | |
| 2007/0034158 A1 * | 2/2007 | Nakaiso | C23C 16/455 118/725 |
| 2007/0077682 A1 * | 4/2007 | Cerio, Jr. | C23C 14/046 438/99 |
| 2007/0077683 A1 * | 4/2007 | Cerio, Jr. | C23C 14/046 438/99 |
| 2007/0095799 A1 * | 5/2007 | Matsuzawa | C23C 16/46 219/121.4 |
| 2007/0215036 A1 | 9/2007 | Park et al. | |
| 2007/0218702 A1 | 9/2007 | Shimizu et al. | |
| 2007/0228458 A1 * | 10/2007 | Henson | H01L 21/823443 257/327 |
| 2007/0234953 A1 | 10/2007 | Kaushal et al. | |
| 2008/0035055 A1 | 2/2008 | Dip et al. | |
| 2008/0050884 A1 * | 2/2008 | Koyanagi | C23C 16/45527 438/387 |
| 2008/0075838 A1 * | 3/2008 | Inoue | C23C 8/10 427/58 |
| 2008/0083372 A1 | 4/2008 | Inoue et al. | |
| 2008/0132069 A1 * | 6/2008 | Lee | C23C 16/405 438/680 |
| 2008/0145533 A1 * | 6/2008 | Honda | C23C 16/405 427/248.1 |
| 2008/0166882 A1 * | 7/2008 | Miya | C23C 16/345 438/761 |
| 2008/0173238 A1 * | 7/2008 | Nakashima | C23C 16/345 118/723 R |
| 2008/0208385 A1 | 8/2008 | Sakamoto et al. | |
| 2008/0251008 A1 * | 10/2008 | Moriya | C23C 16/04 117/88 |
| 2008/0286981 A1 | 11/2008 | Hasper | |
| 2009/0042404 A1 | 2/2009 | Surthi | |
| 2009/0081885 A1 * | 3/2009 | Levy | C23C 16/45519 438/778 |
| 2009/0130829 A1 | 5/2009 | Noda et al. | |
| 2009/0130858 A1 * | 5/2009 | Levy | C23C 16/403 438/765 |
| 2009/0197424 A1 * | 8/2009 | Sakai | C23C 16/405 438/758 |
| 2009/0239078 A1 * | 9/2009 | Asmussen | C23C 16/274 428/408 |
| 2009/0246971 A1 | 10/2009 | Reid et al. | |
| 2009/0305512 A1 * | 12/2009 | Matsuura | C23C 16/45525 438/758 |
| 2010/0050942 A1 | 3/2010 | Kato et al. | |
| 2010/0098851 A1 * | 4/2010 | Murakawa | C23C 16/45544 427/248.1 |
| 2010/0102297 A1 * | 4/2010 | Yoshizumi | B82Y 20/00 257/14 |
| 2010/0105192 A1 * | 4/2010 | Akae | C23C 16/45525 438/478 |
| 2010/0167505 A1 * | 7/2010 | Chew | H01L 21/02532 438/503 |
| 2010/0317174 A1 | 12/2010 | Noda et al. | |
| 2011/0081734 A1 * | 4/2011 | Allsop | C23C 16/305 438/16 |
| 2011/0140334 A1 * | 6/2011 | Zuniga | H01L 21/6719 269/289 R |
| 2011/0159678 A1 * | 6/2011 | Hsu | H01L 21/82345 438/587 |
| 2011/0186984 A1 * | 8/2011 | Saito | H01L 21/02186 257/734 |
| 2011/0287600 A1 * | 11/2011 | Cheng | H01L 21/02639 438/299 |
| 2012/0076936 A1 | 3/2012 | Hirano | |
| 2012/0156886 A1 | 6/2012 | Shirako et al. | |
| 2012/0220137 A1 * | 8/2012 | Ota | C23C 16/345 438/765 |
| 2012/0222620 A1 | 9/2012 | Yudovsky | |
| 2012/0225565 A1 * | 9/2012 | Bhatia | C23C 16/405 438/758 |
| 2012/0258255 A1 * | 10/2012 | Yang | C23C 16/4404 427/237 |
| 2012/0280369 A1 * | 11/2012 | Saito | C23C 16/46 427/255.28 |
| 2012/0315767 A1 | 12/2012 | Sasaki et al. | |
| 2012/0321786 A1 | 12/2012 | Satitpunwaycha et al. | |
| 2013/0026610 A1 * | 1/2013 | Panda | C23C 16/04 117/88 |
| 2013/0032859 A1 * | 2/2013 | Pei | H01L 29/6656 257/192 |
| 2013/0189854 A1 * | 7/2013 | Hausmann | C23C 16/04 117/200 |

(56) References Cited

U.S. PATENT DOCUMENTS

| | | | | |
|---|---|---|---|---|
| 2014/0154414 A1* | 6/2014 | Chuang | ............ | C23C 16/45548 427/248.1 |
| 2014/0256152 A1* | 9/2014 | Ogawa | ................. | C23C 16/405 438/758 |
| 2017/0081761 A1* | 3/2017 | Chuang | ............ | C23C 16/45548 |

* cited by examiner

ATOMIC LAYER DEPOSITION METHOD

PRIORITY CLAIM AND CROSS-REFERENCE

This application claims priority to as a continuation of U.S. patent application Ser. No. 13/692,972, filed Dec. 3, 2012, and entitled "Atomic Layer Deposition Apparatus and Method," now U.S. Pat. No. 9,512,519, which is incorporated herein by reference.

BACKGROUND

An atomic layer deposition (ALD) process is a well known deposition technique in the semiconductor industry. The ALD process employs a precursor material which can react with or chemisorb on a surface in process to build up successively deposited layers, each of which layers being characterized with thickness about only one atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles.

Conventionally, a batch of ALD process usually consists of multiple ALD reaction cycles, each of which ALD reaction cycles involves consequently performing steps of introducing a first gaseous precursor pulse to a surface in process, pulsing an inert gas to purge or evacuate the excess gaseous precursor after the surface is saturated with an atomic layer of the first gaseous precursor, pulsing a second gaseous precursor and purging by an inert gas pulse or evacuating. A single ALD reaction cycle is continuously repeated until a target thickness for the deposited atomic layer on the surface in process is achieved.

The conventional ALD process is widely applicable for growing a thin film, such as a high-k dielectric layer, a diffusion barrier layer, a seed layer, a sidewall, a sidewall oxide, a sidewall spacer for a gate, a metal interconnect and a metal liner etc., in a semiconductor electronic element.

Often, the conventional ALD process is implemented in a furnace, and one batch of ALD process can only form one scale of thickness for an ALD layer on a substrate or a wafer in the furnace. However, for example, there usually exist five different thicknesses in a range from 20A, 25A, 30A, 40A to 43A needed to be formed for sidewall oxidations in one semiconductor device.

Thus, there arises a difficulty to reach full batch control, for example one hundred and twenty-five pieces, since a sidewall stage would require four hours of quality check time for defect reduction. The factors stated above lead to a limitation on the efficiency of ALD for wafer capacity utilization currently, while the quantity of the same thickness of wafer in process (WIP) would be lower than fifty pieces in comparison with the full batch load. This will cause unsatisfactory tool efficiency, and a corresponding low WIP performance will degrade the tool efficiency as well.

However, the ALD process for the batch load with respect to currently uniform size injectors located within the chamber is not yet good enough to be satisfactory, failing to overcome a series of issues related to handling different layer deposition thicknesses for different wafers of the load batch when different reaction cycles are used to elevate the capacity utilization of the batch load within the chamber vacuum furnace.

In addition, full batch control, which includes one hundred and twenty five wafers in process, is difficult due to the sidewall oxidation stage requiring four hours of Q-time (quality time) for defect reduction. Currently, only fifty pieces having same wafer thickness can be in process, which causes poor tool efficiency as well.

There is a need to solve the above deficiencies/issues.

SUMMARY

In an atomic layer deposition apparatus, the atomic layer deposition apparatus includes a chamber and a heating device. The chamber includes a plurality of regions. The heating device respectively provides specific temperature ranges for the plurality of regions.

In an atomic layer deposition apparatus, the atomic layer deposition apparatus includes an injector. The injector has a first hole and a second hole. The first hole has a first geometric parameter. The second hole has a second geometric parameter different from the first geometric parameter.

In an atomic layer deposition process, the atomic layer deposition includes providing a chamber and injecting at least two depositing materials. The chamber has a plurality of regions. The at least two depositing materials is injected into respective ones of the plurality of regions.

BRIEF DESCRIPTION OF THE DRAWINGS

A more complete appreciation of the invention and many of the attendant advantages thereof are readily obtained as the same become better understood by reference to the following detailed description when considered in connection with the accompanying drawing, wherein.

DETAILED DESCRIPTION

Figure 1:
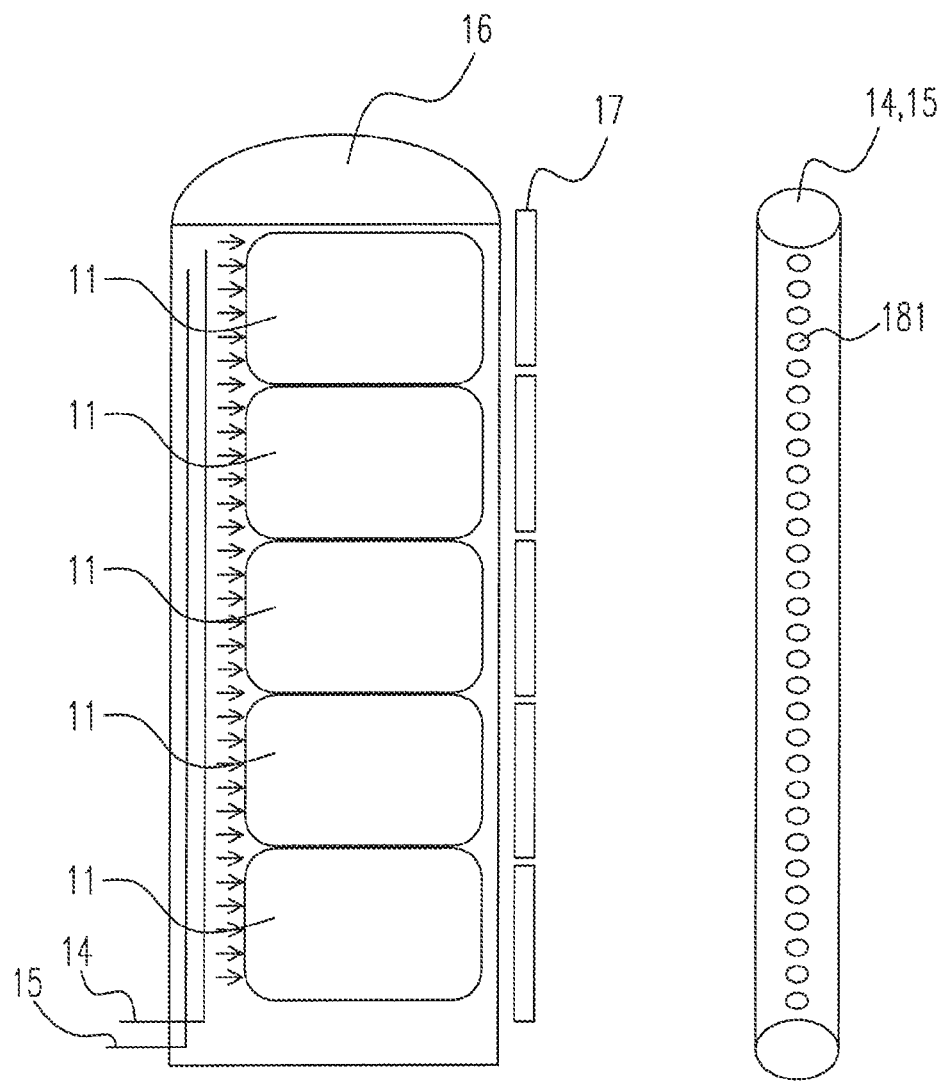
FIG. 1 is a schematic diagram illustrating a full batch load operation in the atomic layer deposition apparatus in accordance with the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly, it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures, and techniques have not been shown in detail in order not to obscure an understanding of this description.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

Figure 2:
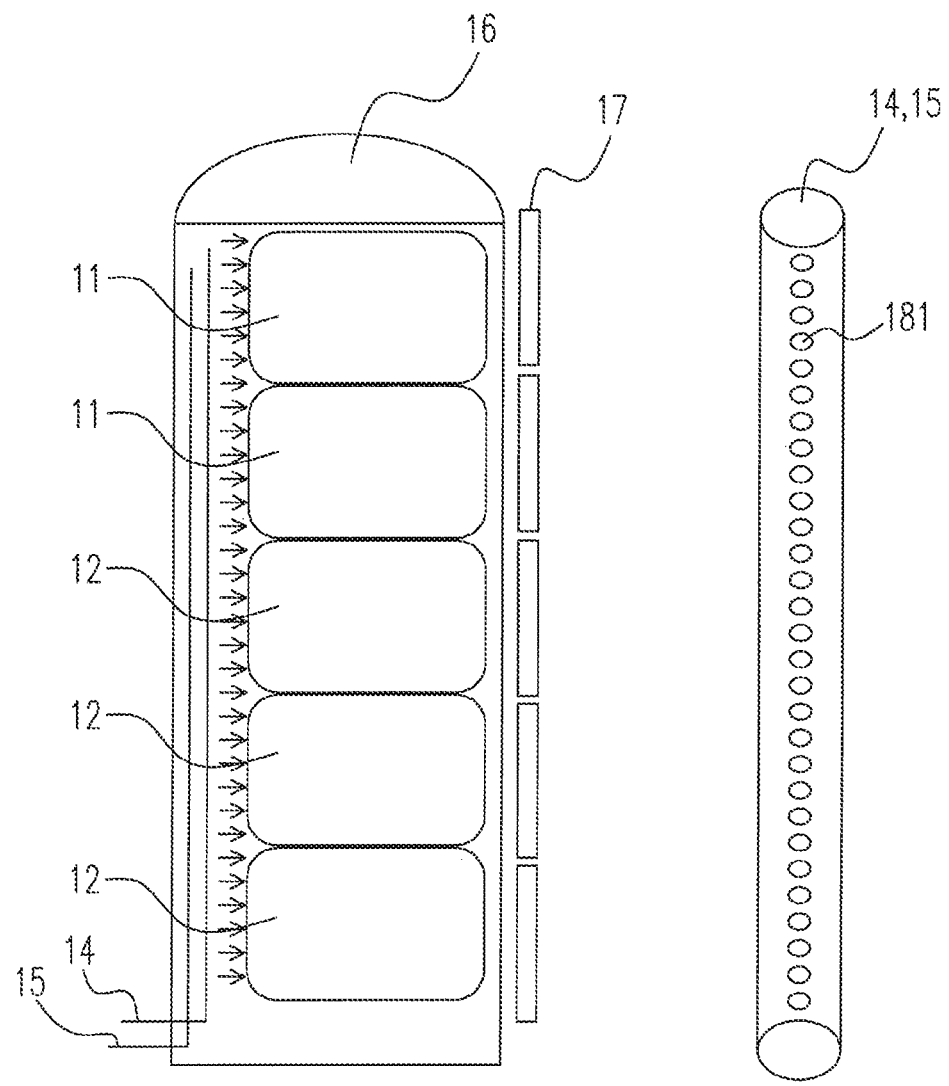
FIG. 2 is a schematic diagram illustrating a partial full batch load operation in the atomic layer deposition apparatus in accordance with the present disclosure.
Figure 3:
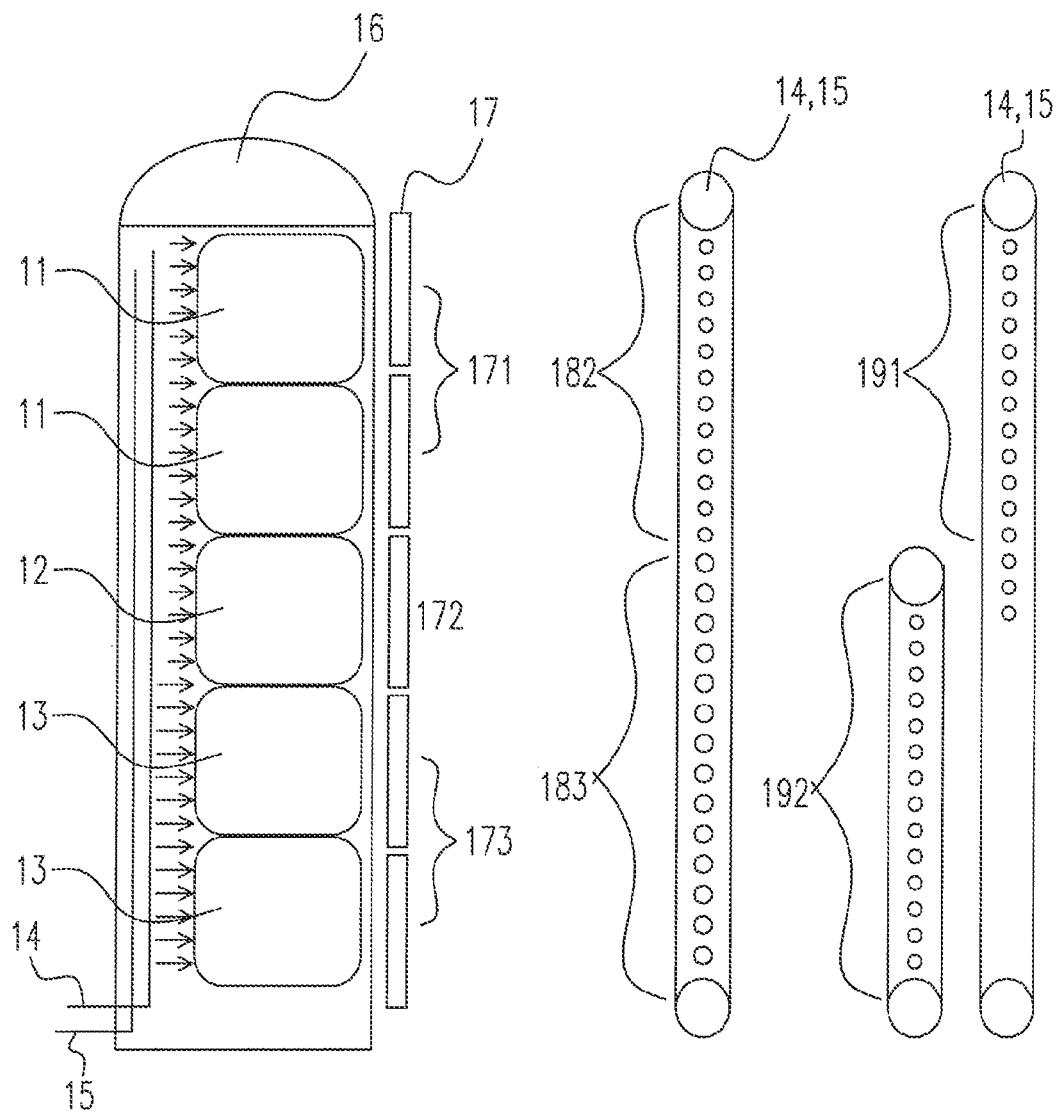
FIG. 3 is a schematic diagram illustrating a full batch load capable of forming with two different thicknesses of deposition layers in one ALD batch in accordance with the present disclosure.

Referring now to FIGS. 1 to 3, an atomic layer deposition apparatus for performing atomic layer deposition processing in accordance with various embodiments of the present disclosure is shown. Injectors 14 and 15 are used for transporting different precursor materials required for performing the atomic layer deposition (ALD), for forming a thin film having a uniform thickness on a top surface of the wafer substrate in a single batch process.

In FIGS. 1 and 2, a series of holes 181 with the same geometric radius are arranged from a bottom side to a top side and open on a pipe wall of both injectors 14 and 15. In some embodiments, the respective injector can have a diameter of about 25 mm, holes of about 1 mm or preferably 3 mm in diameter and a total of 40 holes for a total hole cross-sectional area of about 282 mm2 etc.

The ALD process is commonly applied to form structures such as a high-k dielectric layer, an interconnect barrier layer, a sidewall oxide and a deposition layer in a porous structure, etc. For example, in a formation of a high-k dielectric layer, for forming films such as an Al03 film, a Hf02 film and a Zr02 film acting as a high-k dielectric layer, corresponding candidate precursor material pair can be chosen as Al(CH3)3 plus either H2O or O3, either HfC14 or TEMAH plus H2O and ZrC14 plus H20. H2O may be a popular candidate for acting as a precursor material since H2O vapor is adsorbed on most materials or surfaces including a silicon surface of a wafer face.

FIG. 1 illustrates a full batch load operation in the atomic layer deposition apparatus in accordance with the present disclosure. The ALD apparatus used in the ALD process includes a furnace 16 having a vacuum chamber divided into multiple regions 11, for example, five regions 11, and a heating device 17 configured in proximity to the multiple regions 11 for providing and tuning specific temperature ranges for the multiple regions 11, respectively, for forming a one-heater-for-multiple-region configuration or a multiple-region-per-heater configuration. In some embodiments, the heating device 17 is configured as including multiple heaters, each of which heaters corresponds respectively to one of the multiple regions 11, for forming a one-heater-per-region configuration. In some embodiments, a multiple-heater-per-region configuration is accordingly derived. The ALD apparatus further includes dual or more injectors 14 and 15 having multiple holes 181 and configured in the vacuum chamber.

In some embodiments, the five regions 11 are fully loaded with wafers in process, which results in relatively high capacity utilization. During one batch ALD process, precursors A and B in gaseous state are alternatively introduced into the furnace 16 through the injectors 14 and 15 to form a deposited film with thickness A onto multiple wafers being placed in each region 11. Deposition rate is related to temperature. To achieve a uniform deposition rate, the temperatures in the five regions 11 are controllable by the heating device 17.

Referring to FIG. 2, a schematic diagram illustrating a partially full batch load operation in the atomic layer deposition apparatus in accordance with the present disclosure is shown. In some embodiments, one batch of conventional ALD processing only forms one scale of thickness for the sidewall oxide, so that the processing capacity for the one batch of ALD processing may not be fully loaded with wafers in process and some dummy regions 12 may be empty or partially loaded with wafers in process. But, for instance, there may exist five different scales of thicknesses required to be formed for the sidewall oxide in a semiconductor device, thus the productivity and the capacity utilization performance for the overall ALD process has to be improved. In some embodiments, one batch of ALD process forms at least two scales of different thicknesses for a deposited layer, for example a sidewall oxide. In some embodiments, the configuration is the same as that of FIG. 1, differing only in that two regions 11 are fully loaded with wafers in process, and the other three dummy regions 12 are empty, which results in relatively low capacity utilization.

In some embodiments of the invention, region temperature tuning and hole size optimization of the injector are utilized to improve atomic layer deposition efficiency. The atomic layer deposition process tool shown in FIGS. 1 and 2 handles two different wafer deposition thicknesses in a single cycle of the batch deposition to increase efficiency measured up to 90%, while the daily throughput approaches around three hundred pieces.

FIG. 3 is a schematic diagram illustrating a full batch load capable of forming two deposition layers of different thicknesses in one ALD batch in accordance with the present disclosure. The injectors 14 and 15 have multiple first holes 182 having a first radius dimension and multiple second holes 183 having a second radius dimension, and can emit gaseous deposition materials at different discharge rates, labeled by two different types of arrows shown in FIG. 3, to produce two sets of thicknesses: thickness A for regions 11 and thickness B for regions 13. Region 12 is a dummy region acting as a buffer region possibly exhibiting imprecise separation of the two different thicknesses of the deposition regions within the chamber. The heaters 17 are distinguished into three different temperature control sections, such that a first section 171, a second section 172 and a third section 173 are capable of providing different temperatures. The first section provides a first temperature in the two regions 11 for growing a film with thickness A on the wafer. The second section 172 provides a second temperature in the buffer region 12. The third section 173 provides a third temperature in the two regions 13 for growing a film with thickness B on the wafer. The first, second, and third temperatures may be all different or all the same, or two of the first, second, and third temperatures may be the same, and one of the temperatures different from the two same temperatures. Number of temperature control sections is not limited to three herein, and more or fewer temperature control sections may be used (e.g., 2 temperature control sections, or more than 3 temperature control sections).

Another effect which needs to be considered while forming two or more scales of different thicknesses for deposition layers in one batch of ALD processing arises from the fact that a relatively thicker layer may require relatively longer processing time. Hence, a dummy reaction cycle is introduced in some embodiments for the regions used for processing depositing of a relatively thinner layer, so as to align the different processing times for respective relatively thicker and thinner layers. Finally, the multiple different processing times for the respective scales of different thicknesses for deposition layers can be aligned and the respective relatively thicker and thinner layers are finished at the same time at the end of the batch of ALD processing.

Figure 4:
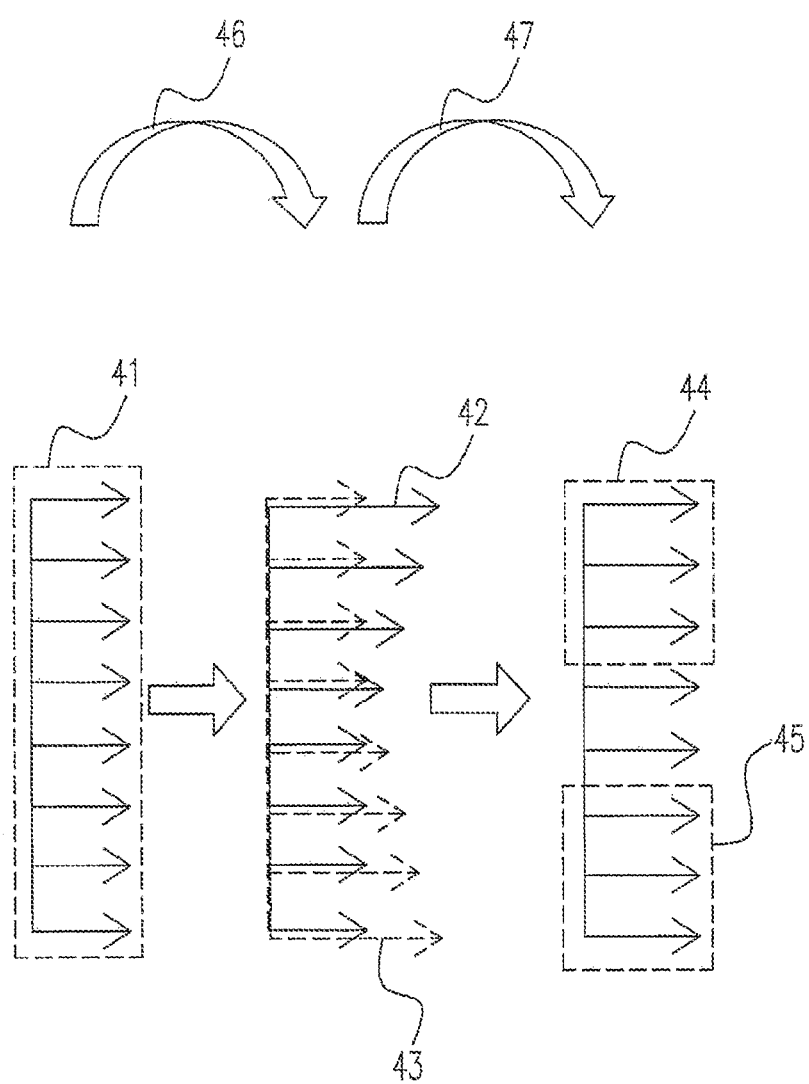
FIG. 4 is a schematic diagram illustrating the injection rate of precursors having two radiuses of holes and temperature tuning compensation of the invention in accordance with the present disclosure.

FIG. 4 is a schematic diagram illustrating injection rates of precursor holes having at least two radius dimensions in the same injector in combination with the temperature tuning compensation scheme for the atomic layer deposition in accordance with the present disclosure. In a stage 46, a first emitting precursor material having a speed profile 42 for forming films with thickness A is emitted from the holes with first radius dimension 182 on the injectors 14 and 15 and deposited onto the wafer, and a second emitting precursor material having a speed profile 43 for forming films with thickness B is emitted from the holes with second radius dimension 183 on the injectors 14 and 15 and deposited onto the wafer. The speed profiles 42 and 43 for the first and second emitting materials are then merged to form two different thickness films in one batch cycle, and to replace a conventional emitting material 41 for forming a single thickness film in one batch cycle. In a stage 47, the heater 17 capable of providing different temperatures respectively to the speed profiles 42 and 43 for the multiple emitting materials is involved to fine tune respective non-uniform and discrete speed profiles 42 and 43 for the first and second emitting materials to be aligned and integrally formed into an even profile. The speeds profiles 42 and 43 for the first and second emitting materials are respectively illustrated with different lengths of arrows as shown in FIG. 4. In the stage 47, the unequal speed profiles 42 and 43 for the first and second emitting materials are equalized into the equalized speed profiles 44 and 45 for the first and second emitting materials as shown in FIG. 4 after implementing the temperature tuning and compensation scheme.

Figure 5:
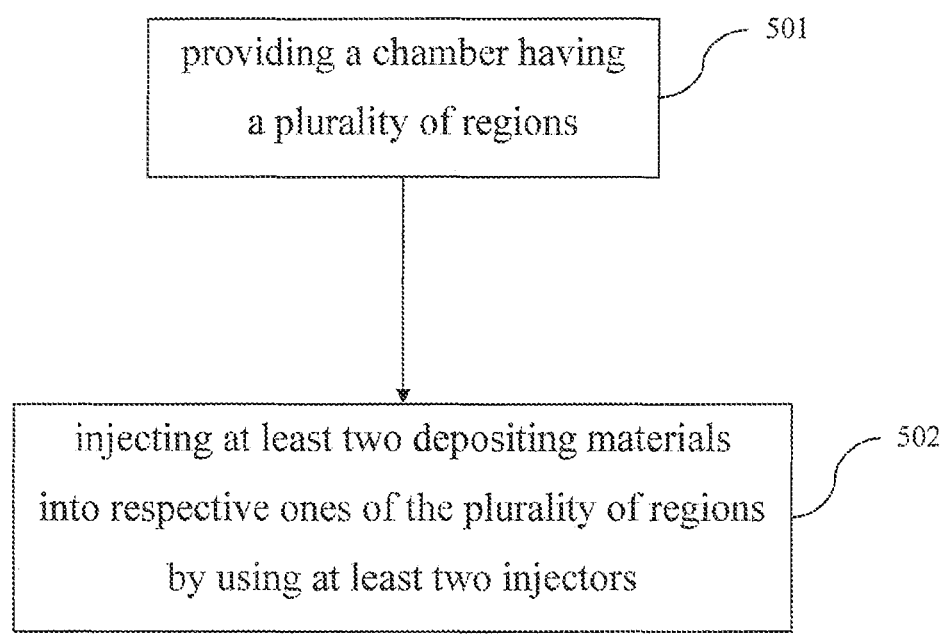
FIG. 5 is a flow chart illustrating the atomic layer deposition process having at least two depositing materials.

FIG. 5 is a flow chart illustrating an atomic layer deposition process having at least two depositing materials in accordance with various embodiments of the present disclosure. The process in FIG. 5 includes providing a chamber having a plurality of regions in step 501, injecting at least two depositing materials into respective ones of the plurality of regions by using at least two injectors in step 502. In this process, the at least two depositing materials are deposited through different injectors 14 and 15, as shown in FIG. 1, on the surface of the wafer substrate, wherein the depositing materials may have the same recipe. The depositing materials can range from Oxides, Nitrides, and Metals to Sulphides for the wafers located within the mentioned plurality of regions 11 in FIG. 1. These steps show how to perform the layer deposition process.

Figure 6:
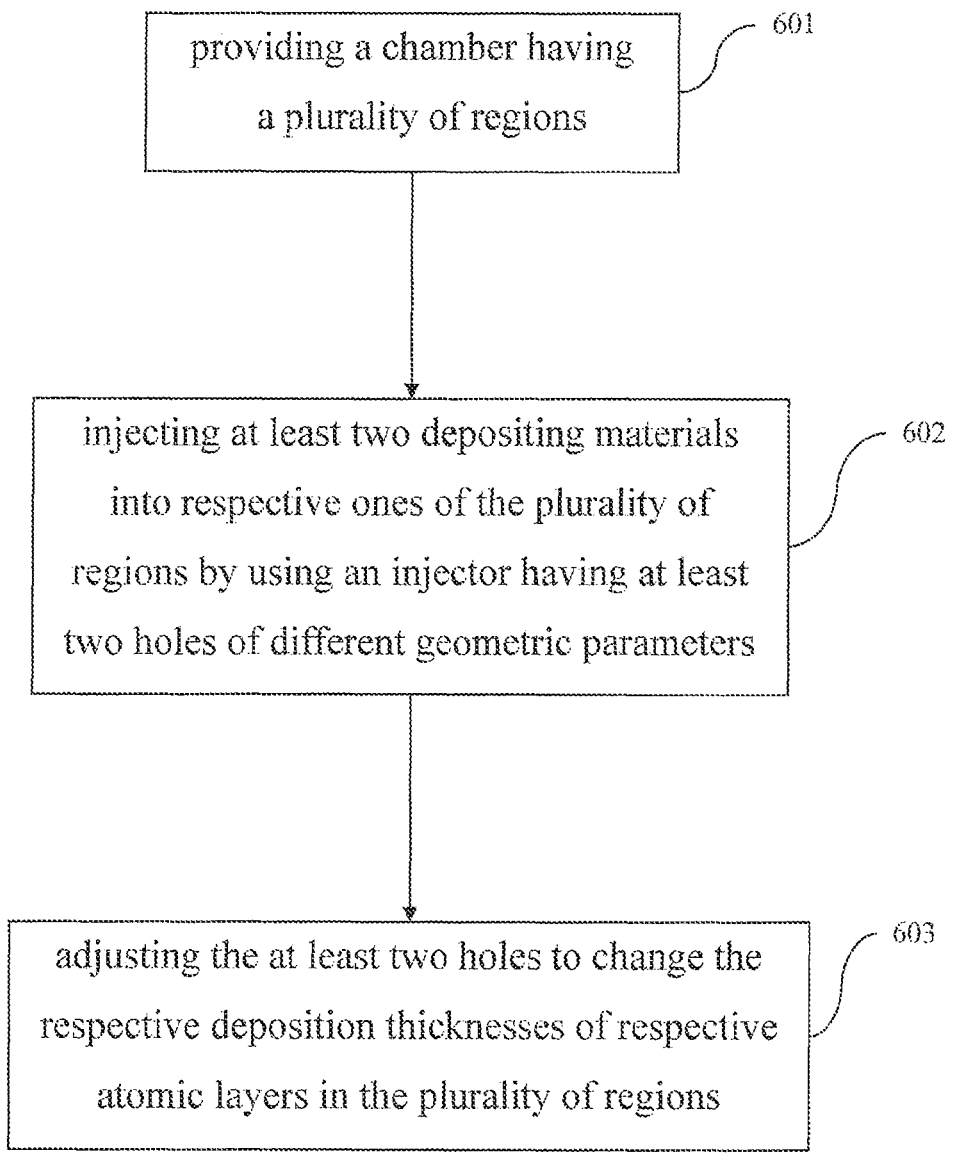
FIG. 6 is a flow chart illustrating the atomic layer deposition process having at least two holes of different geometric parameters.

FIG. 6 is a flow chart illustrating another atomic layer deposition process in accordance with various embodiments of the present disclosure. The process in FIG. 6 includes providing a chamber having a plurality of regions in step 601, injecting at least two depositing materials into respective ones of the plurality of regions by using an injector having at least two holes of different geometric parameters in step 602, and adjusting the at least two holes to change the respective deposition thicknesses of respective atomic layers in the plurality of regions in step 603. In some embodiments, the geometric parameters represent a size, a shape, an area and so on, and the adjustment is accomplished by replacing the injector or modifying the holes of the injector. The at least two holes of different sizes can be used to produce the different deposition thicknesses for atomic layers in the corresponding regions. In addition, the at least two depositing materials may have the same recipe or different recipes.

Figure 7:
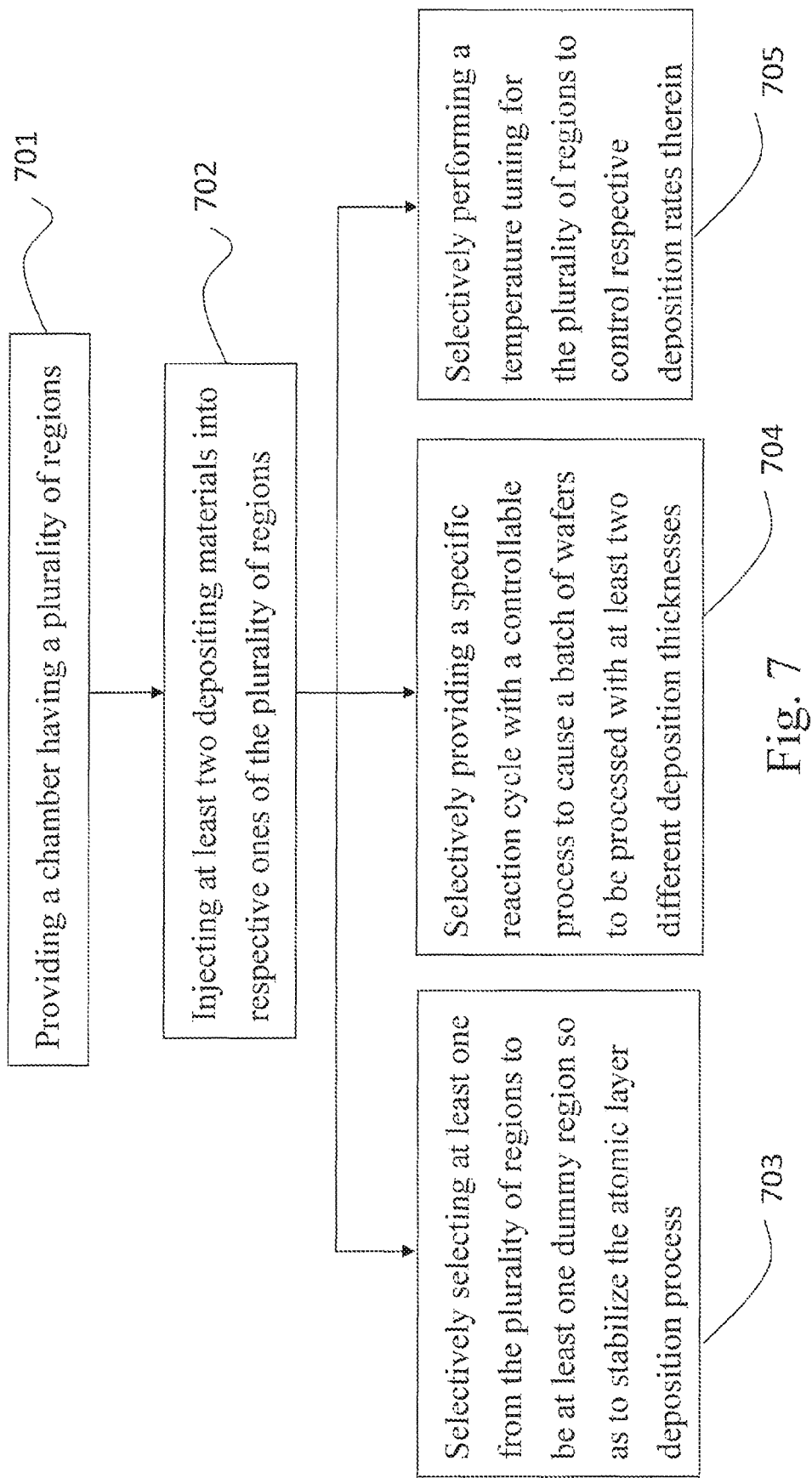
FIG. 7 is a flow chart illustrating the atomic layer deposition process performing a temperature tuning for the plurality of regions.

FIG. 7 is a flow chart illustrating yet another atomic layer deposition process in accordance with various embodiments of the present disclosure. The process in FIG. 7 includes two basic steps of providing a chamber having a plurality of regions in step 701, and injecting at least two depositing materials into respective ones of the plurality of regions in step 702. In some embodiments, steps 703, 704 and 705 follow the step 702 for the process. In step 703, at least one from the plurality of regions is selected to be at least one dummy region and the dummy region functioning as a buffer is configured between the two regions for the respective depositing materials, so that the atomic layer deposition process is stabilized. In step 704, a specific reaction cycle with a controllable process is provided to cause the wafers in the different regions to have different deposition thicknesses, namely a batch of wafers is processed with at least two different deposition thicknesses. In step 705, a temperature tuning is performed for the plurality of regions, and the plurality of regions have different temperatures to control respective deposition rates therein.

The above-mentioned controllable dummy cycle and the dummy region in cooperation with a temperature tuning scheme and acting as a buffer cycle and a buffer region that can respectively align multiple different processing times and exhibit imprecise separation is introduced into the ALD process, which enables a formation of two different thicknesses of the deposition layer within one batch of the ALD process. Thus, the introduced dummy region, the above controllable process, and the temperature tuning upgrade the productivity and the capacity utilization performance for the ALD process.

One general aspect of embodiments described herein includes an atomic layer deposition process, including: providing a chamber having a plurality of regions. The atomic layer deposition process also includes injecting at least two depositing materials into respective ones of the plurality of regions to form a first thin film having a first thickness on a first substrate in a first region of the plurality of regions while simultaneously forming a second film having a second thickness on a second substrate in a second region of the plurality of regions, the second region being vertically offset from the first region.

Another general aspect of embodiments described herein includes a method including: (a) placing a first wafer into a first region of a chamber and a second wafer into a second region of the chamber; (b) heating the first region to a first predetermined temperature and heating the second region to a second predetermined temperature; (c) delivering first precursor gas at a first gaseous flow rate in the first region to form a first material at a first deposition rate while simultaneously delivering the first precursor gas at a second gaseous flow rate in the second region to form the first material at a second deposition rate different than the first deposition rate; and (d) subsequent to the step of delivering first precursor gas, delivering a second precursor gas at a third gaseous flow rate in the first region to form a second material at a third deposition rate while simultaneously delivering the precursor gas at a fourth gaseous flow rate in the second region to form the second material at a fourth deposition rate different than the third deposition rate.

Yet another general aspect of embodiments described herein includes a method including: providing a first wafer in a first region of a chamber and providing a second wafer in a second region of the chamber, the second region being vertically offset from the first region; and forming in the first region a first film having a first thickness, and forming in the second region a second film having a second thickness different from the first thickness simultaneously with forming of the first film having the first thickness, the first film and second film having the same composition, by: delivering a first precursor gas through a first injector having a first gas flow path, the first gas flow path including a first hole with a first geometric parameter and a second hole with a second geometric parameter different from the first geometric parameter, the first precursor gas being delivered at a first gaseous flow rate in the first region and simultaneously being delivered at a second gaseous flow rate in the second region; and delivering a second precursor gas through a second injector having a second gas flow path, the second gas flow path including a third hole with a third geometric parameter and a fourth hole with a fourth geometric parameter different from the third geometric parameter, the second precursor gas being delivered at a third gaseous flow rate in the first region and being delivered at a fourth gaseous flow rate in the second region.

While the disclosure has been described in terms of what are presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. A method, comprising:
providing a chamber having a plurality of heated regions; and
delivering a first precursor gas through first holes having a first size and a first shape, at a first gaseous flow rate in a first region to form a first material to a first thickness at a first deposition rate while simultaneously delivering the first precursor gas through second holes having a second size and a second shape at a second gaseous flow rate in a second region to form the first material to a second thickness different than the first thickness at a second deposition rate different than the first deposition rate, wherein the second size is different than the first size, the second shape is different than the first shape, or both the second size and second share are different than the first size and first shape, respectively; and
subsequent to the step of delivering first precursor gas, delivering a second precursor gas through the first holes at a third gaseous flow rate in the first region to form a second material at a third deposition rate while simultaneously delivering the second precursor gas through the second holes at a fourth gaseous flow rate in the second region to form the second material at a fourth deposition rate different than the third deposition rate.

2. The method according to claim 1, wherein the delivering step includes using at least two injectors to respectively inject the at least two depositing materials.

3. The method according to claim 2, wherein the at least two depositing materials have the same recipe.

4. The method according to claim 1, wherein the method comprises adjusting size of at least two holes to change the respective deposition thicknesses of respective atomic layers in the plurality of regions.

5. The method according to claim 1, wherein the method includes an atomic layer deposition process and further comprising selecting at least one from the plurality of regions to be at least one dummy region to stabilize the atomic layer deposition process.

6. The method according to claim 1, further comprising providing a specific reaction cycle with a controllable process to cause a batch of wafers to be processed with at least two different deposition thicknesses.

7. The method according to claim 1, further comprising performing a temperature tuning for the plurality of regions to control respective deposition rates therein.

8. A method comprising:
placing a first wafer into a first region of a chamber and a second wafer into a second region of the chamber, the second region being vertically offset from the first region;
heating the first region to a first predetermined temperature and heating the second region to a second predetermined temperature;
delivering a first precursor gas through first holes having a first size and a first shape, at a first gaseous flow rate in the first region to form a first material to a first thickness at a first deposition rate while simultaneously delivering the first precursor gas through second holes having a second size and a second shape at a second gaseous flow rate in the second region to form the first material to a second thickness different than the first thickness at a second deposition rate different than the first deposition rate, wherein the second size is different than the first size, the second shape is different than the first shape, or both the second size and second share are different than the first size and first shape, respectively; and
subsequent to the step of delivering first precursor gas, delivering a second precursor gas through the first holes at a third gaseous flow rate in the first region to form a second material at a third deposition rate while simultaneously delivering the second precursor gas through the second holes at a fourth gaseous flow rate in the second region to form the second material at a fourth deposition rate different than the third deposition rate.

9. The method of claim 8, further comprising:
delivering an inert gas to purge the chamber after delivering the first precursor gas and before delivering the second precursor gas.

10. The method of claim 9, further comprising: a cycle of repeating the steps of delivering first precursor gas, delivering a second precursor gas, and delivering an inert gas until a film of a desired thickness has been formed on the first wafer.

11. The method of claim 10, further comprising introducing one or more dummy reaction cycles into the cycle of repeating the steps of delivering first precursor gas, delivering a second precursor gas, and delivering an inert gas, in which one or more dummy reaction cycles the first gaseous flow rate is reduced to zero and the third gaseous flow rate is reduced to zero.

12. The method of claim 8, further comprising configuring conditions within the chamber such that the first material chemisorbs on a surface of the first wafer and on a surface of the second wafer.

13. The method of claim 8, further comprising delivering the first precursor gas through an injector, the injector having a first plurality of holes in the first region and a second plurality of holes in the second region, wherein the first plurality of holes differs from the second plurality of holes by a geometric characteristic selected from the group consisting of hole size, hole shape, and hole area.

14. The method of claim 8, further comprising heating a third region of the chamber, interjacent the first region and the second region, to a third predetermined temperature.

15. The method of claim 8, further comprising monitoring temperature within the first region and the second region and tuning the temperature to ensure a film with a desired thickness is formed in the first region and the second region.

16. A method comprising:
providing a first wafer in a first region of a chamber and providing a second wafer in a second region of the chamber, the second region being vertically offset from the first region; and
forming in the first region a first film having a first thickness, and forming in the second region a second film having a second thickness different from the first thickness simultaneously with forming of the first film having the first thickness, the first film and second film having the same composition, by:
delivering a first precursor gas through a first injector having a first gas flow path, the first gas flow path including a first hole with a first geometric parameter and a second hole with a second geometric parameter different from the first geometric parameter, the first precursor gas being delivered at a first gaseous flow rate in the first region and simultaneously being delivered at a second gaseous flow rate in the second region; and
delivering a second precursor gas through a second injector having a second gas flow path, the second gas flow path including a third hole with a third geometric parameter and a fourth hole with a fourth geometric parameter different from the third geometric parameter, the second precursor gas being delivered at a third gaseous flow rate in the first region and being delivered at a fourth gaseous flow rate in the second region.

17. The method of claim 16, further including delivering an inert gas into the chamber between delivering the first precursor gas and delivering the second precursor gas.

18. The method of claim 16, further including heating the first region to a first predetermined temperature and heating the second region to a second predetermined region.

19. The method of claim 16, wherein the first, second, third and fourth geometric parameters are selected from the group consisting of hole size, hole shape and hole area.

* * * * *